United States Patent [19]

Zwernemann

[11] 3,891,479

[45] June 24, 1975

[54] METHOD OF MAKING A HIGH CURRENT SCHOTTKY BARRIER DEVICE

[75] Inventor: Ross Zwernemann, Phoenix, Ariz.

[73] Assignee: Motorola, Inc., Chicago, Ill.

[22] Filed: Mar. 12, 1973

[21] Appl. No.: 340,642

Related U.S. Application Data

[63] Continuation of Ser. No. 190,494, Oct. 19, 1971, abandoned.

[52] U.S. Cl. .................... 148/175; 29/578; 29/589; 117/200; 117/217; 148/187; 357/15; 357/20; 357/88

[51] Int. Cl. ....... H01l 3/00; H01l 5/00; H01l 29/48

[58] Field of Search .................... 148/174, 175, 187; 317/234, 235; 29/578, 589; 117/200, 212, 217, 227

[56] References Cited

UNITED STATES PATENTS

| | | | |
|---|---|---|---|
| 3,244,950 | 4/1966 | Ferguson | 148/175 X |
| 3,370,995 | 2/1968 | Lowery et al. | 148/175 |
| 3,513,366 | 5/1970 | Clark | 317/235 |
| 3,541,403 | 11/1970 | Lepselter et al. | 148/175 X |
| 3,646,411 | 2/1972 | Iwasa | 317/235 UA |

FOREIGN PATENTS OR APPLICATIONS

| | | | |
|---|---|---|---|
| 2,037,533 | 2/1971 | Germany | 317/235 |
| 1,139,495 | 1/1969 | United Kingdom | 317/235 |

OTHER PUBLICATIONS

Lathrop, J. W., "Semiconductor Network Technology—1964" Proc. IEEE, Dec., 1964, p. 1430–1444.

Jacobus et al., "Complementary Transistors" IBM Tech. Discl. Bull., Vol. 14, No. 4, Sept. 1971, p. 1045.

*Primary Examiner*—L. Dewayne Rutledge
*Assistant Examiner*—W. G. Saba
*Attorney, Agent, or Firm*—Vincent J. Rauner; Henry T. Olsen

[57] ABSTRACT

A heavily doped N type conductivity substrate having a lightly doped N type conductivity epitaxial layer grown thereon with a centrally located buried layer diffused therein and a second lightly doped N type conductivity epitaxial layer grown on the first layer with a P type conductivity guardring diffused therein. The guardring is generally coaxial with the buried layer and a layer of metal is deposited on the surface of the second epitaxial layer to form a Schottky barrier device with the guardring lying generally below the periphery thereof. The buried layer extends upwardly within the guardring to provide a substantially uniform or constant thickness of lightly doped semiconductive material between the junction of the device and the heavily doped substrate.

2 Claims, 4 Drawing Figures

METHOD OF MAKING A HIGH CURRENT SCHOTTKY BARRIER DEVICE

BACKGROUND OF THE INVENTION

This is a continuation of application Ser. No. 190,494, filed Oct. 19, 1971, and now abandoned.

FIELD OF THE INVENTION

Schottky or surface barrier devices, which are formed by a metal-to-semiconductor interface, are, theoretically, very useful devices, especially in high speed applications. It has been found, however, that Schottky barrier devices have a relatively high reverse bias leakage current and do not exhibit a well-defined bulk breakdown reverse bias voltage. To overcome these problems guardrings are incorporated in the Schottky barrier device, such as described in U.S. Pat. No. 3,541,403, which guardring underlies the edge of the semiconductor-metal junction to reduce leakage current along the edge. The guardring is formed by diffusing impurities for providing conductivity of a type opposite to that of the semiconductive material into the semiconductive material.

DESCRIPTION OF THE PRIOR ART

When constructing a Schottky barrier device, the semiconductor layer is generally formed with a first layer of heavily doped material and a second layer of lightly doped material having the layer of barrier metal deposited thereon. The thickness of the lightly doped layer of semiconductive material is one of the factors which determines the maximum reverse bias voltage which can be applied to the device. When a guardring is diffused into the lightly doped layer of semiconductive material, the thickness of the layer is reduced and, consequently, the reverse bias voltage which may be applied thereto is reduced.

To compensate for this problem the prior art increases the thickness of the lightly doped layer of semiconductive material. However, this increase in the thickness of the layer increases the internal resistance of the device in the active region (the semiconductive material within the guardring) which in turn increases the power consumption of the device.

SUMMARY OF THE INVENTION

The present invention pertains to an improved Schottky barrier device and method of manufacture including a Schottky barrier device having a guardring diffused into a lightly doped layer of semiconductive material forming a portion thereof and a second layer of lightly doped semiconductive material having a buried layer therein to provide an overall lightly doped layer of semiconductor material having a substantially uniform or constant thickness.

It is an object of the present invention to provide an improved Schottky barrier device.

It is a further object of the present invention to provide an improved Schottky barrier device including a guardring and having a relatively low internal resistance.

It is a further object of the present invention to provide an improved Schottky barrier device wherein the thinnest portion and, consequently, the portion which determines the maximum allowable reverse bias voltage, of the semiconductive layer occurs in the active region of the device.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
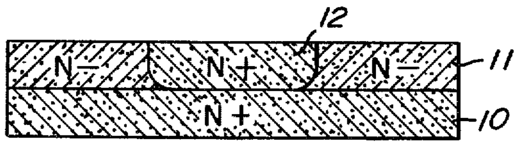
FIGS. 1 through 4 are cross-sectional views illustrating sequential steps performed during the manufacture of an improved Schottky barrier device.
Figure 2:
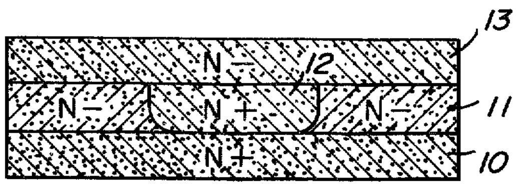
Figure 3:
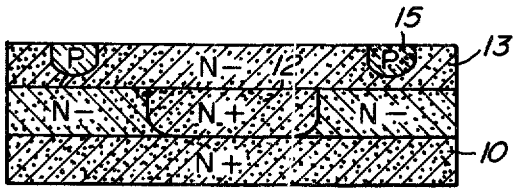
Figure 4:
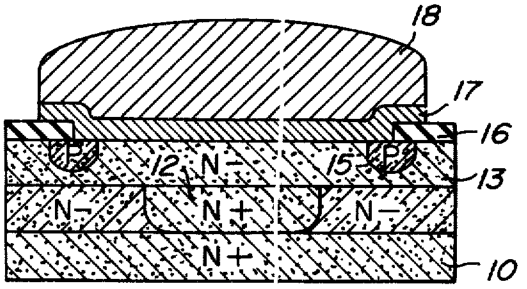

Referring to the figures, the numeral 10 designates a substrate layer of semiconductive material which is heavily doped, or contains a relatively high concentration of impurities providing a first conductivity type. A second layer 11, which in this embodiment is an epitaxial layer grown on the first layer 10, is lightly doped, or contains a relatively light concentration of impurities providing the first type of conductivity. In the present embodiment the first type of conductivity is N type, although it is believed that either conductivity type, N or P, might be utilized.

A central portion of the layer 11 has a relatively high concentration of impurities diffused therein, by any of the well-known techniques, to produce a buried layer 12 wherein the impurity concentration, and, hence, the resistivity is approximately equal to that of the layer 10. In the present embodiment the substrate 10 is a circular disk and the buried layer 12 is approximately concentrically located within the grown layer 11 thereon. The buried layer 12 extends through the layer 11 and into electrical contact with the layer 10 to provide a relatively low resistance path through the lightly doped layer 11.

After the buried layer 12 is diffused into the lightly doped layer 11, a third layer 13, which in this embodiment is a second epitaxial layer grown on the surface of the first epitaxial layer 11, is positioned over the layer 11 and the buried layer 12 therein. The layer 13 is doped with a relatively light concentration of impurities providing the first type of conductivity, in this embodiment the N type, so that the resistivity of the third layer 13 and the second layer 11 is approximately similar.

Once the third layer 13 is grown on the second layer 11, a guardring 15 is formed therein. The guardring 15 is formed by diffusing a relatively light concentration of impurities providing conductivity of a second type (in this embodiment the second type is P type conductivity) into the third layer 13 in a continuous concentric ring. The inner diameter of the guardring 15 is such that the shortest distance between the guardring 15 and the buried layer 12 is at least as great as the thickness of the third layer 13 directly above the buried layer 12. Further, the guardring 15 is approximately equidistant from the buried layer 12 around the entire periphery of the buried layer 12 and, in this embodiment where the buried layer 12 and guardring 15 are circular, the guardring 15 is coaxial with the buried layer 12. The guardring 15 may be diffused into the layer 13 through use of any of the well-known techniques.

Once the guardring 15 is diffused into the layer 13, a layer 16 of insulating material, which may be silicon dioxide or the like, is deposited on the upper surface of layer 13 and a centrally located generally coaxial aperture is formed therein. A layer 17 of barrier and contact metals is deposited over a portion of the insulator 16 and the upper surface of the layer 13 exposed by the aperture through the layer 16 to form a Schottky barrier. A layer 18 of contact metal is then deposited on the layer 17 to form an electrical contact therewith. The layers 16, 17 and 18 are illustrated in a normal or relatively standard form and it should be understood that they need not necessarily be formed in the sequence described. Further, the outer periphery of the aperture through the layer 16 must lie concentric with and generally above the guardring 15 so that the periphery or edge of the Schottky barrier is generally above the guardring 15. To accomplish this it may be necessary to provide the layer 16 with the central aperture thereon prior to the diffusion of the guardring 15. A layer of material (not shown) providing conductivity of the second type, may be deposited over the insulating layer 16 in a ring having an inner diameter slightly smaller than the inner diameter of the layer 16. The impurities from the slightly doped ring may then be diffused downwardly into the layer 13 to form the guardring 15 and the layers 17 and 18 may be deposited thereover using standard techniques. Thus, it should be understood that the specific sequence of the steps for forming the various layers and guardring may be altered somewhat without departing from the spirit and scope of this invention.

In operation, the guardring 15 is spaced at least as far from any of the heavily doped layers, including the buried layer 12 and substrate 10, as the junction of the layer 17 and the layer 13 is from the buried layer 12. Thus, the maximum reverse bias voltage which may be applied across the device is dictated by the thickness of the active portion of the semiconductive material, which is generally that portion of the layer 13 encircled by guardring 15. Further, since the thickness of the layer 13 determines the maximum reverse bias voltage of the device, the thickness can be adjusted to withstand safely only the maximum desired voltage and, because the thickness will be as small as practical, the internal resistance of the device will be minimized.

Thus, an improved Schottky barrier device is disclosed wherein a guardring may be utilized to reduce the leakage current and improve the reverse bias voltage thereof without increasing the internal resistance of the device. The device is constructed so that the thickness of the active portion of the semiconductive material dictates the maximum allowable reverse bias voltage which can be applied to the device, rather than the distance between the guardring and the heavily doped substrate. Thus, the active portion of the semiconductive material can be formed with a minimum thickness to minimize the internal resistance of the device. Because the internal resistance is minimized, the power consumption is minimized and the turn-on voltage is stabilized.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit of this invention.

I claim:

1. A method of constructing improved high current Schottky barrier devices including the steps of:

a. growing a first epitaxial layer, with a relatively light concentration of impurities for providing conductivity of a first type, on a substrate layer with a relatively heavy concentration of impurities for providing conductivity of the first type;
b. diffusing a relatively heavy concentration of impurities into a central portion of said first epitaxial layer for providing conductivity of the first type, said central portion extending through said first epitaxial layer into contact with said substrate layer;
c. growing a second epitaxial layer, with a relatively light concentration of impurities for providing conductivity of a first type, on said first epitaxial layer;
d. diffusing a guardring of impurities, for providing conductivity of a second type, into said second epitaxial layer in a relatively light concentration and substantially equally spaced about said central portion of said first epitaxial layer;
e. depositing a layer of insulating material on the surface of said second epitaxial layer and forming an aperture therethrough having an outer periphery located generally above and coextensive with said guardring, and exposing a portion of the surface of the second epitaxial layer; and
f. depositing barrier and contact metals on the exposed portion of the surface of the second epitaxial layer to form a Schottky barrier.

2. A method as set forth in claim 1 wherein the said guardring of impurities are diffused into the central portion of the second epitaxial layer so that the guardring is approximately equidistant from said central portion of the first epitaxial layer and from the substrate layer.

* * * * *